United States Patent
Ahn et al.

(10) Patent No.: US 7,041,555 B2
(45) Date of Patent: May 9, 2006

(54) METHOD FOR MANUFACTURING FLASH MEMORY DEVICE

(75) Inventors: Jung Ryul Ahn, Namyangju-Shi (KR); Jum Soo Kim, Icheon-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/883,279

(22) Filed: Jun. 30, 2004

(65) Prior Publication Data
US 2005/0048718 A1  Mar. 3, 2005

(30) Foreign Application Priority Data
Sep. 1, 2003  (KR) ................... 10-2003-0060792

(51) Int. Cl.
*H01L 21/336* (2006.01)
(52) U.S. Cl. .................... 438/257; 438/258
(58) Field of Classification Search ............... 438/257, 438/258; 257/315
See application file for complete search history.

(56) References Cited

U.S. PATENT DOCUMENTS

| | | | |
|---|---|---|---|
| 5,841,163 A * | 11/1998 | Joo et al. | 257/316 |
| 6,777,294 B1 * | 8/2004 | Park | 438/264 |
| 2003/0222292 A1 * | 12/2003 | Joo et al. | 257/296 |
| 2005/0205905 A1 * | 9/2005 | Rhodes | 257/292 |

FOREIGN PATENT DOCUMENTS

JP   10-41487   2/1998

* cited by examiner

*Primary Examiner*—Phat X. Cao
*Assistant Examiner*—Theresa T. Doan
(74) *Attorney, Agent, or Firm*—Marshall, Gerstein & Borun LLP

(57) ABSTRACT

Disclosed is a method for manufacturing a flash memory device. In a process of forming a flash memory cell and a select transistor through a process of forming a polysilicon layer for a floating gate, a process of forming a dielectric layer and a process of forming a polysilicon layer for a control gate, the dielectric layer is formed and the dielectric layer in a region where a select transistor will be formed is then removed, thereby forming a select gate line in which the polysilicon layer for the floating gate and the polysilicon layer for the control gate are electrically connected. Furthermore, in a process of forming a flash memory cell and a select transistor through a process of forming a polysilicon layer for a floating gate, a process of forming a dielectric layer and a process of forming a polysilicon layer for a control gate, forming an interlayer insulating layer on the entire structure and then forming a contact, the dielectric layer on the polysilicon layer for the floating gate in a region where a select transistor will be formed and the polysilicon layer for the control gate are all removed whereby the polysilicon layer for the floating gate and a contact plug are directly electrically connected.

3 Claims, 9 Drawing Sheets

METHOD FOR MANUFACTURING FLASH MEMORY DEVICE

BACKGROUND

1. Field of the Invention

The present invention relates to a method for manufacturing a flash memory device, and more specifically, to a method for manufacturing a flash memory device having an NAND type structure.

2. Discussion of Related Art

A semiconductor memory device consists of a cell for storing data therein, and peripheral transistors for transferring an external voltage to the cell so that the cell is driven.

A semiconductor memory device includes an NAND type flash memory device. A plurality of memory cell transistors included in the NAND type flash memory device are connected in a structure called a string. In order to select such a string, a select transistor is required.

The type of the select transistor can be classified into two. The first type includes a drain select transistor for supplying the current of a cell transistor as if it serves as a drain in a common MOSFET. Gates of the drain select transistor are electrically connected one another to form a gate line. Such a gate line becomes a drain select line. The second type includes a source select transistor that serves as a source in a common MOSFET. Gates of the source select transistor are electrically connected one another to form a gate line. Such a gate line becomes a source select line.

FIG. 1 is a layout diagram illustrating a typical NAND type flash memory cell array.

Referring to FIG. 1, a plurality of active regions 101 are formed in parallel in predetermined regions of a semiconductor substrate. An impurity is implanted into the active regions 101. Meanwhile, gate lines such as a drain select line DSL, word lines WLa1 to Wlan and WLb1 to WLbn and a source select line SSL are formed on the semiconductor substrate in a direction vertical to the active regions 101.

As such, the NAND type flash memory cell array is composed of the active regions 101, the drain select line DSL and the source select line SSL.

Meanwhile, since these select transistors are formed at the same time when the flash memory cell is fabricated, a bias has to be applied to a first polysilicon layer corresponding to a floating gate in order for the select transistors to operate normally. As such, in order to apply the voltage to the first polysilicon layer corresponding to the floating gate, a contact process is performed.

In case of an NAND flash cell, the operating speed of the cell is sensitive to a resistance value of a select transistor formed using a contact. Currently, the select transistor formed using the contact consists of only resistance of the first polysilicon layer and resistance of the polysilicon layer is about 70 $\Omega$/sheet to 100 $\Omega$/sheet. Due to the development of a photolithography process, if the size of a cell is reduced, the height of the cell is inevitably limited. For such technological developments, the height of the polysilicon layer must be also reduced. Thus, it is inevitable that resistance of the select transistor continues to increase.

As a result, since resistance of the polysilicon layer is very high, it is required that contacts 102 be formed with a predetermined distance and be applied with a bias. The same is true of the drain select line DSL or the source select line SSL. As such, in order to form the contacts 102, a region where the contacts 102 will be formed in a word line direction must be added. This causes the size of a memory chip to increase and the number of a die manufactured per wafer to decrease. In addition, in order to secure a process margin in a photolithography process, a gap between the select transistor and a neighboring cell has to be increased. This requires an additional region in the bit line direction to further reduce the number of a die manufactured per wafer.

Meanwhile, the threshold voltage of the select transistor must be high so as to prevent degradation in the operating properties of the cell due to the leakage current. As such, in order to make the threshold voltage of a transistor higher than the threshold voltage of a memory cell, an ion implantation process for ion implantation control has to be additionally performed, which increases the process step.

SUMMARY OF THE INVENTION

The present invention presents a method for manufacturing a flash memory device wherein in a process of forming a flash memory cell and a select transistor through a process of forming a polysilicon layer for a floating gate, a process of forming a dielectric layer and a process of forming a polysilicon layer for a control gate, the dielectric layer is formed and the dielectric layer in a region where a select transistor will be formed is then removed, thereby forming a select gate line in which the polysilicon layer for the floating gate and the polysilicon layer for the control gate are electrically connected.

Furthermore, the present invention presents a method for manufacturing a flash memory device wherein in a process of forming a flash memory cell and a select transistor through a process of forming a polysilicon layer for a floating gate, a process of forming a dielectric layer and a process of forming a polysilicon layer for a control gate, forming an interlayer insulating layer on the entire structure and then forming a contact, the dielectric layer on the polysilicon layer for the floating gate in a region where select transistor will be formed and the polysilicon layer for the control gate are all removed whereby the polysilicon layer for the floating gate and a contact plug are directly electrically connected.

Accordingly, the present invention can reduce a contact resistance and a sheet resistance of a select gate line to improve an operating speed of a device and can reduce a contact area to increase the integration level.

According to a preferred embodiment of the present invention, there is provided a method for manufacturing a flash memory device, comprising the steps of: providing a semiconductor substrate having isolation regions, cell regions and peripheral circuit regions; forming polysilicon layer patterns on the semiconductor substrate; wherein the first polysilicon layer patterns includes first polysilicon patterns for word lines and second polysilicon patterns for select lines; forming a dielectric layer on the polysilicon layer patterns and the semiconductor substrate; selectively removing the dielectric layer on the second polysilicon layer patterns for the select lines; forming a second polysilicon layer and a conductive material layer on the second polysilicon layer patters for the select lines and the first dielectric layer covering the first polysilicon layer patterns for the word lines; implementing a patterning process to form the select lines and the word lines.

In the above, the dielectric layer formed in a peripheral circuit region can be also removed by means of the process of removing the dielectric layer.

Meanwhile, the method may further comprises the step of implanting an impurity into the first polysilicon layer from which the dielectric layer is removed and that is thus exposed in order to lower resistance of the first polysilicon layer.

Furthermore, the conductive material layer may be formed using W, WSix, CoSix or TiSix.

According to another embodiment of the present invention, there is provided a method for manufacturing a flash memory device, comprising the steps of providing a semiconductor substrate in which a plurality of word lines, a drain select line and a source select line are formed, wherein the word lines have a stack structure of a material layer for a floating gate, a dielectric layer and a material layer for a control gate; forming an interlayer insulating layer on the entire structure; forming a contact hole through which the material layer for the floating gate in the drain select line and the source select line is exposed; and filling the contact hole with a conductive material layer to form a contact plug.

In the above, the method may further comprises the step of before the contact plug is formed, implanting an impurity into the material layer for the floating gate that is exposed through the contact hole in order to lower resistance of the material layer for the floating gate.

Also, the contact plug may be formed using polysilicon or a metal material.

DETAILED DESCRIPTION OF PREFERRED EMBODIMENTS

Figure 1:
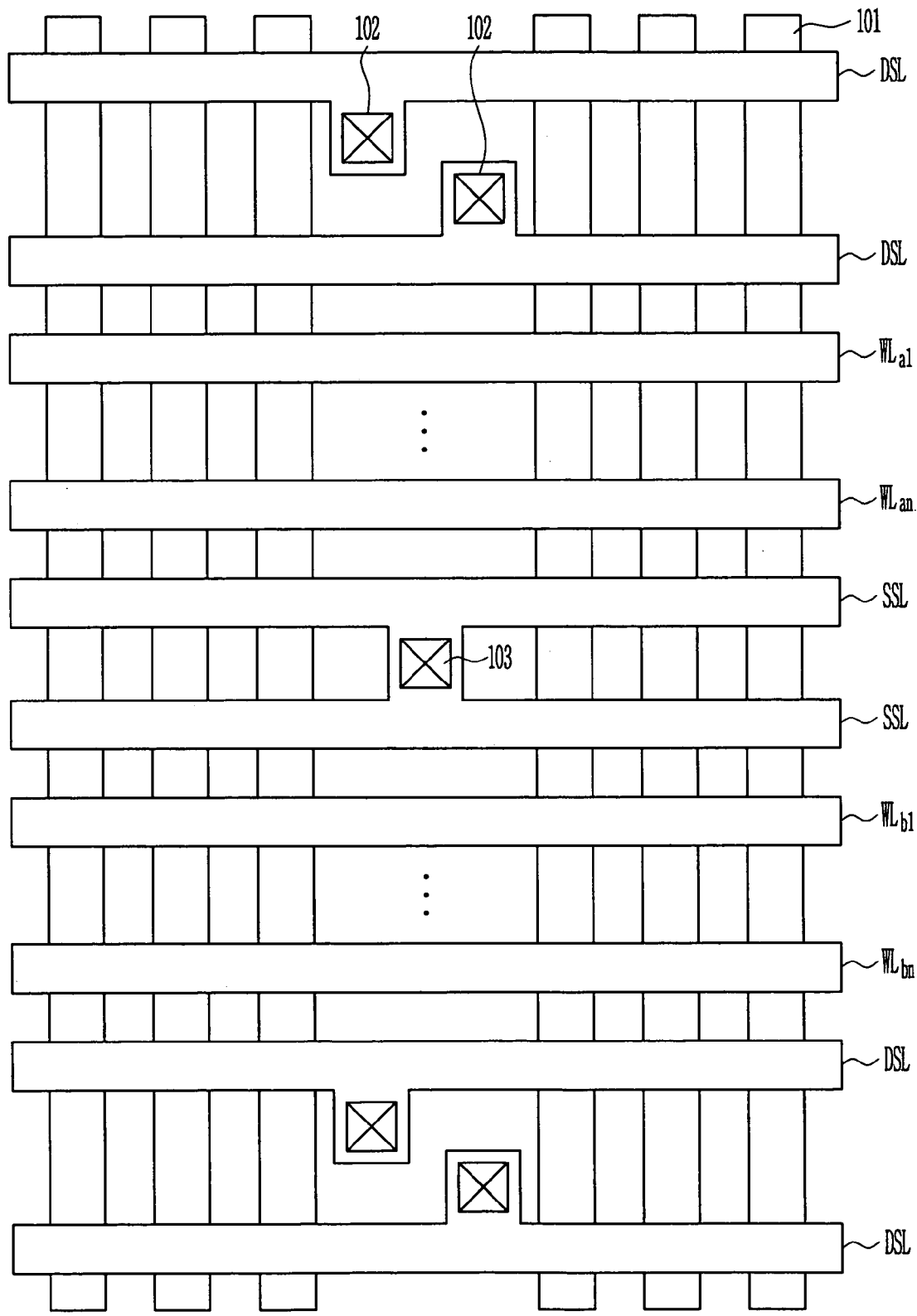
FIG. 1 is a layout diagram illustrating a typical NAND type flash memory cell array.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Meanwhile, in case where it is described that one layer is "on" the other layer or a semiconductor substrate, the one layer may directly contact the other layer or the semiconductor substrate. Or, a third layer may be intervened between the one layer and the other layer or the semiconductor substrate. Further, in the drawing, the thickness and size of each layer are exaggerated for convenience of explanation and clarity. Like reference numerals are used to identify the same or similar parts.

Figure 2:
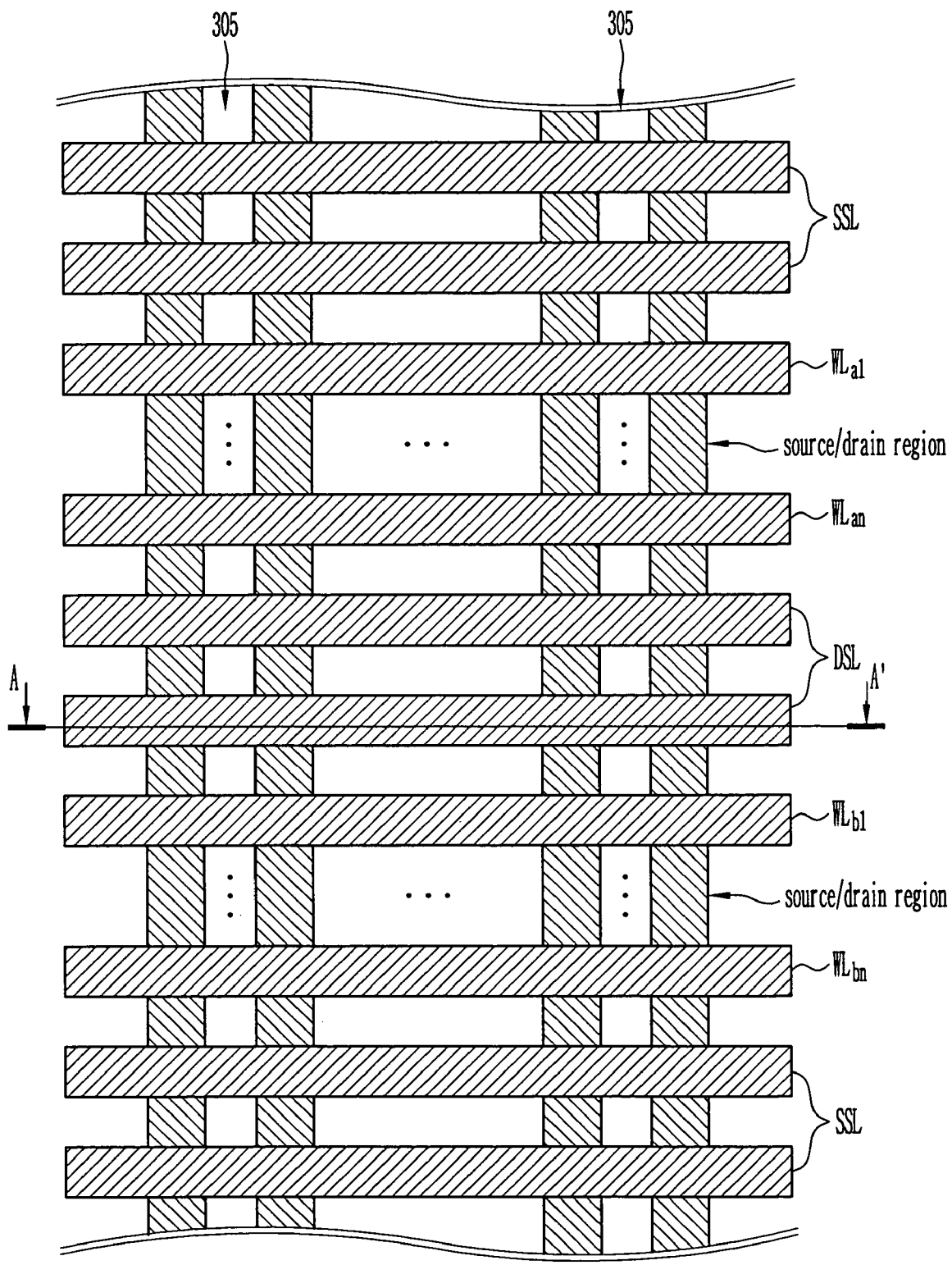
FIG. 2 is a layout diagram shown to explain a method for manufacturing a flash memory device according to an embodiment of the present invention.

FIG. 2 is a layout diagram shown to explain a method for manufacturing a flash memory device according to an embodiment of the present invention.

Referring to FIG. 2, a cell array of the flash memory device according to the present invention includes a plurality of isolation layers 305 formed in parallel one another, a plurality of word lines WLa1 to Wlan and WLb1 to WLbn, drain select lines DSL, source select lines SSL and source/drain regions. The word lines WLa1 to Wlan and WLb1 to WLbn and the select lines DSL and SSL are formed in a direction vertical to the isolation layers 305.

In the above, the word lines WLa1 to Wlan and WLb1 to WLbn and the select lines DSL and SSL are formed at the same time by means of the same process. The word lines and the select lines have a stack structure of a polysilicon layer for a floating gate/a dielectric layer/a polysilicon layer for a control gate.

Meanwhile, the select lines DSL and SSL are formed so that the polysilicon layer for the floating gate and the polysilicon layer for the control gate are directly brought into contact if the dielectric layer between the polysilicon layer for the floating gate and the polysilicon layer for the control gate is removed.

It is thus possible to reduce the contact resistance of the select lines DSL and SSL and also to omit a contact process that is implemented in order to apply a bias to the polysilicon layer for the floating gate. Further, since an area for forming a contact becomes unnecessary, the distance of the select line DSL or SSL becomes narrow to improve the integration level.

A method for manufacturing the flash memory device constructed above will now be described.

FIG. 3A to FIG. 3F are cross-sectional views sequentially illustrating the flash memory device taken along lines A–A' in FIG. 2 in order to explain the method for manufacturing the flash memory device according to an embodiment of the present invention.

Figure 3A:
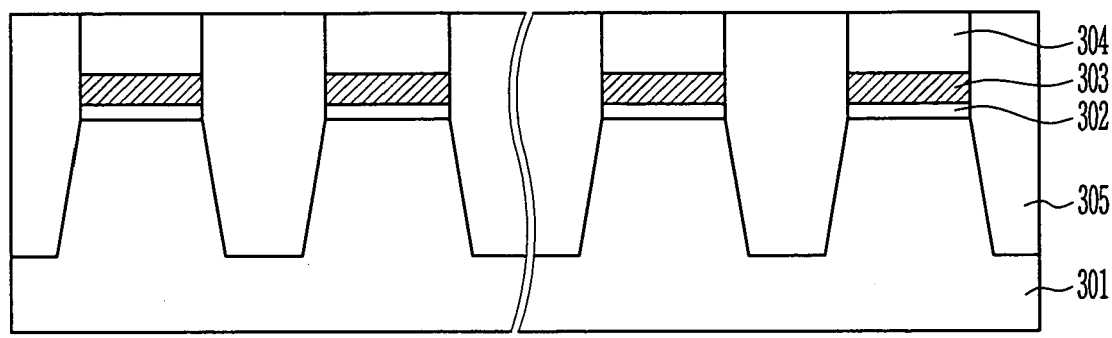
FIG. 3A to FIG. 3F are cross-sectional views sequentially illustrating a flash memory device taken along lines A–A' in FIG. 2 in order to explain a method for manufacturing the flash memory device according to an embodiment of the present invention.

Referring to FIG. 3A, a well is formed by means of an ion implantation process. A gate oxide layer 302, a first polysilicon 303 for a floating gate and a hard mask 304 are deposited on a semiconductor substrate 301 in which an ion implantation layer for controlling the threshold voltage of a transistor is formed. In the above, the hard mask 304 may be formed using a nitrification layer. Thereafter, the hard mask 304, the first polysilicon layer 303 and the tunnel oxide layer 302 are sequentially patterned by means of an etch process. An exposed region (an isolation region) of the substrate 301 adjacent to the first floating gate 303 is etched at a predetermined depth, forming a trench.

Thereafter, an insulating layer is formed by means of a chemical vapor deposition method so that the trench is completely filled. The insulating layer on the hard mask 304 is then removed and the insulating layer remains only in the trench, thus forming an isolation layer 305. At this time, the insulating layer on the hard mask 304 can be removed by means of a chemical mechanical polishing process.

Figure 3B:
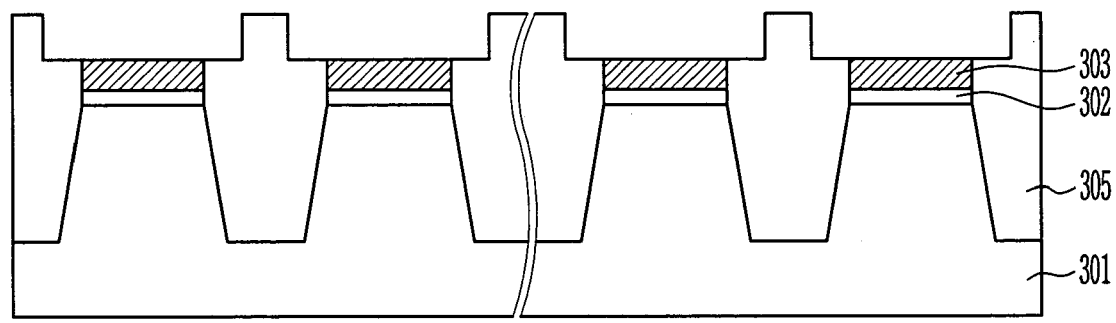

By reference to FIG. 3B, the hard mask (304 in FIG. 3A) is removed. At this time, the top of the isolation layer 305 is exposed in a projected shape while the hard mask 304 is being removed. A portion of the exposed top is etched to reduce the width of the top of the isolation layer 305. A distance between the projected isolation layers 305 is thus increased.

Figure 3C:
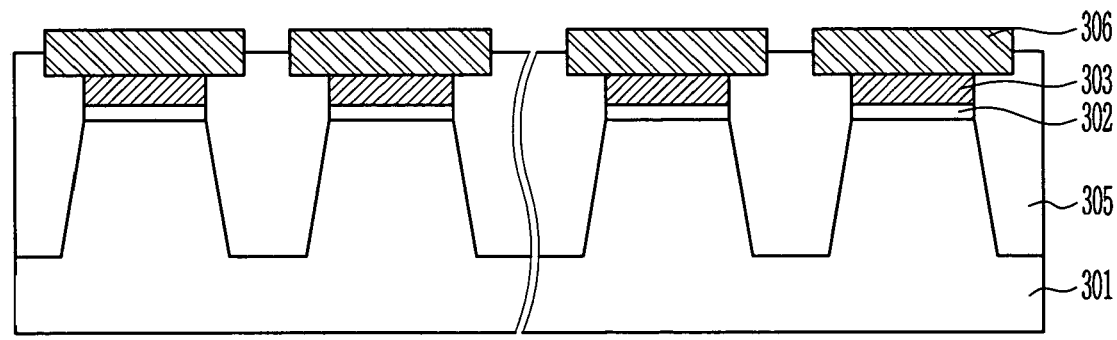

With reference to FIG. 3C, a second polysilicon layer 306 for a floating gate is formed on the entire structure. A chemical mechanical polishing process is then implemented until the projected surface of the isolation layer 305 is exposed. The second polysilicon layer 306 remains only on the first polysilicon layer 303 and the top edges of the isolation layer 305 in a self-aligned manner, while being isolated by the projection of the isolation layer 305.

Thereafter, in order to increase the surface area of the second polysilicon layer 306, a portion of the projection of the isolation layer 305 may be etched. If a portion of the projection of the isolation layer 305 is etched, the surface area of the second polysilicon layer 306 is increased while a sidewall of the second polysilicon layer 306 is exposed. This is for increasing the coupling ratio between the floating gate and the control gate.

Figure 3D:
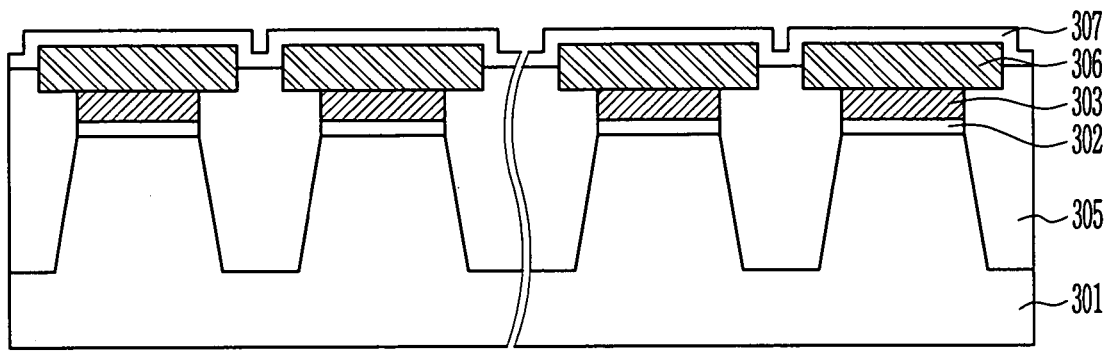

Referring to FIG. 3D, a dielectric layer 307 is formed on the entire structure.

Figure 3E:
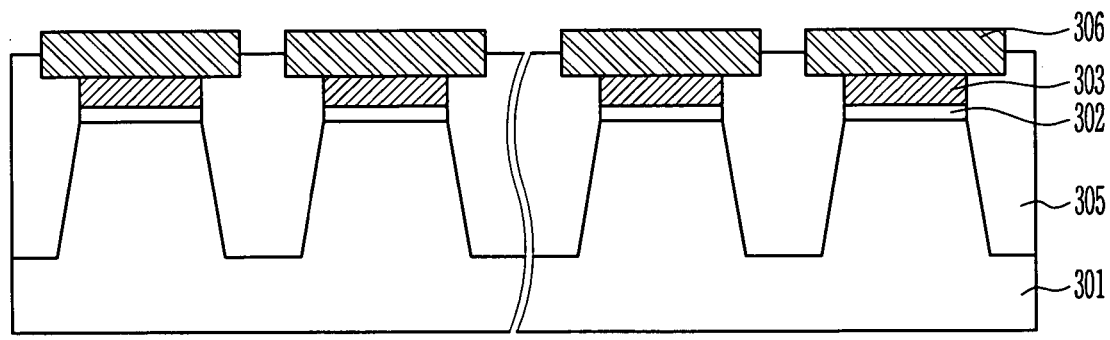

By reference to FIG. 3E, the dielectric layer (307 in FIG. 3D) formed on the second polysilicon layer 306 in the select lines (DSL and SSL in FIG. 2) is removed. The dielectric layer remains only in the remaining regions except for the select line (DSL and SSL in FIG. 2) region.

In the above, it is possible to remove the dielectric layer formed in a peripheral circuit region (not shown) while removing the dielectric layer (307 in FIG. 3D) formed on the second polysilicon layer 306. The dielectric layer may be removed in a dry or wet etch mode.

Meanwhile, an opening, which is formed on the second polysilicon layer 306 as the dielectric layer is removed, preferably has a short side and a long side whose ratio is over 1:2.

Thereafter, in order to further reduce the sheet resistance of the second polysilicon layer 306, an impurity may be implemented into the second polysilicon layer 306 of the select line (DSL and SSL in FIG. 2) region, which is exposed as the dielectric layer is removed.

Figure 3F:
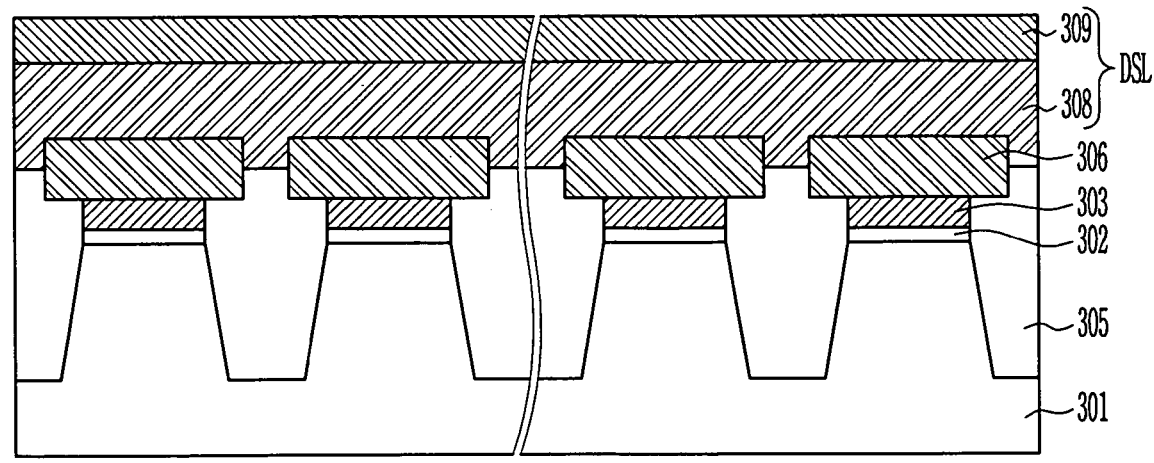

Referring to FIG. 3F, a third polysilicon layer 308 for a control gate and a tungsten silicide layer 309 are formed on the entire structure. At this time, the control gate may be formed by depositing only a conductive material such as W, WSix, CoSix and TiSix instead of the third polysilicon layer 308 and the tungsten silicide layer 309. Alternately, after the third polysilicon layer 308 is formed, the conductive material such as W, WSix, CoSix and TiSix may be deposited on the layer 308.

Thereafter, the tungsten silicide layer 309, the third polysilicon layer 308, the dielectric layer 307, the second polysilicon layer 306 and the first polysilicon layer 303 are patterned by means of an etch process using an etch mask in which word lines and select lines are defined, thus forming the select lines (DSL and SSL in FIG. 2) and word lines WLa1 to Wlan and WLb1 to WLbn.

Accordingly, the word lines WLa1 to Wlan and WLb1 to WLbn are formed to have a structure of a floating gate consisting of the first and second polysilicon layers 303 and 306, the dielectric layer 307, and a control gate consisting of the third polysilicon layer 308 and the tungsten silicide layer 309.

At the same time, the select lines (DSL and SSL in FIG. 2) in which the first to third polysilicon layers 303, 306 and 308 are directly physically and electrically connected are formed. As such, it is possible to reduce a sheet resistance and a contact resistance of the select lines (DSL and SSL in FIG. 2) in such a manner that the dielectric layer of the select line (DSL and SSL in FIG. 2) region is selectively removed and the first to third polysilicon layers 303, 306 and 308 are directly physically and electrically connected to form the select lines (DSL and SSL in FIG. 2).

Next, an impurity is implanted into the semiconductor substrate 301 by means of an ion implantation process, thus forming source/drain in an active region around the select lines (DSL and SSL in FIG. 2) and the word lines WLa1 to Wlan and WLb1 to WLbn.

A method for manufacturing a flash memory device according to another embodiment of the present invention will now be described.

Figure 4:
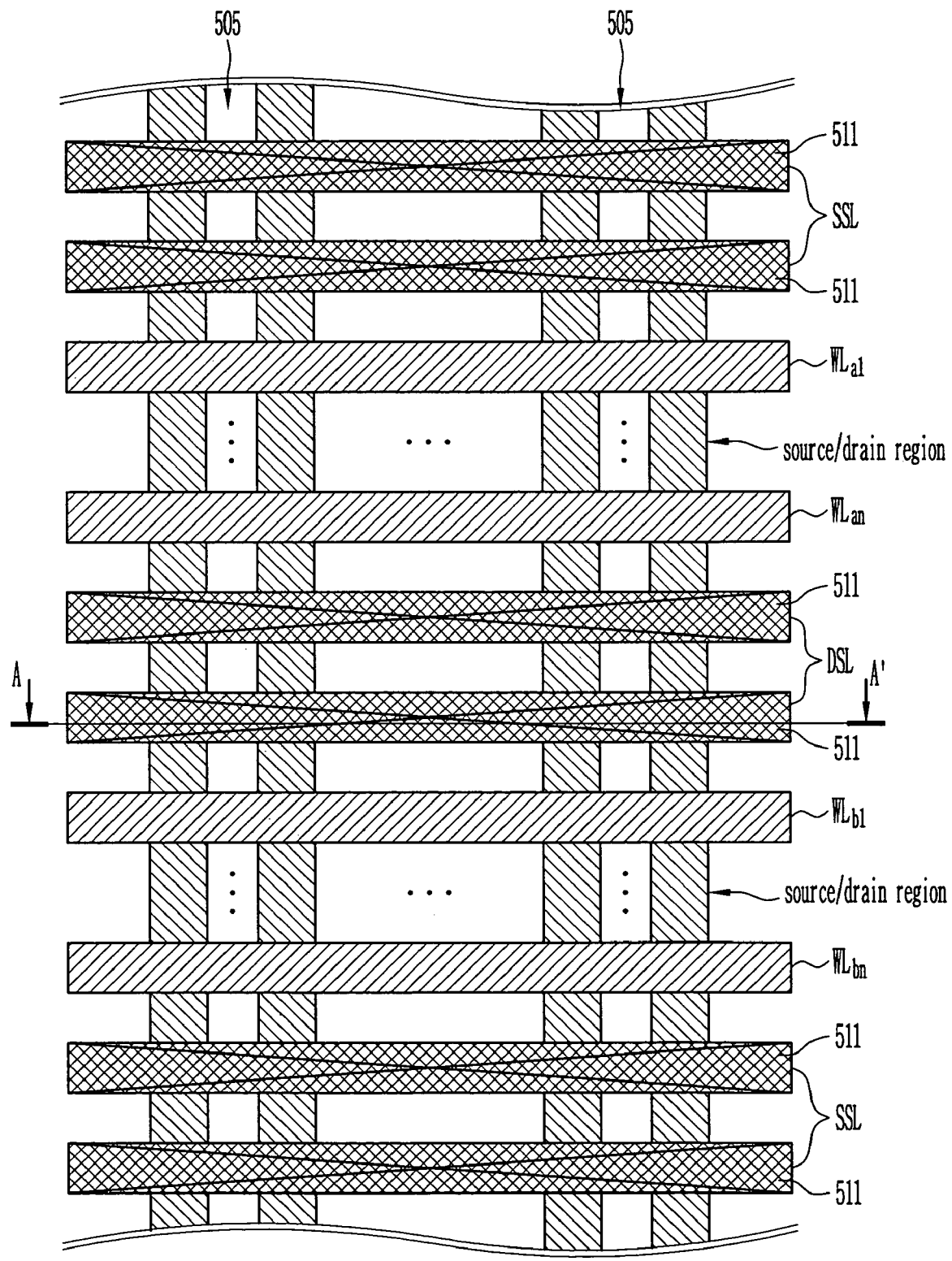
FIG. 4 is a layout diagram shown to explain a method for manufacturing a flash memory device according to another embodiment of the present invention.

FIG. 4 is a layout diagram shown to explain a method for manufacturing a flash memory device according to another embodiment of the present invention.

Referring to FIG. 4, a cell array of the flash memory device according to the present invention is similar to the array shown in FIG. 2. In the cell array shown in FIG. 4, select lines DSL and SSL are formed to have a stack structure of a polysilicon layer for a floating gate/a dielectric layer/a polysilicon layer for a control gate in the same manner as the word lines WLa1 to Wlan and WLb1 to WLbn, and an etch is performed up to the polysilicon layer for the control gate and the dielectric layer so that a contact plug and the polysilicon layer for the floating gate are directly brought into contact in the process of forming a contact on the select lines DSL and SSL.

It is thus possible to reduce the contact resistance of the select lines DSL and SSL and the contact plug and also to omit a contact process that is implemented in order to apply a bias to the polysilicon layer for the floating gate. Further, since an area for forming a contact becomes unnecessary, the distance of the select line DSL or SSL becomes narrow to improve the integration level.

A method for manufacturing the flash memory device constructed above will be below described.

FIG. 5A to FIG. 5F are cross-sectional views sequentially illustrating flash memory devices taken along lines A–A' in FIG. 4 in order to explain the method for manufacturing the flash memory device according to an embodiment of the present invention.

Figure 5A:
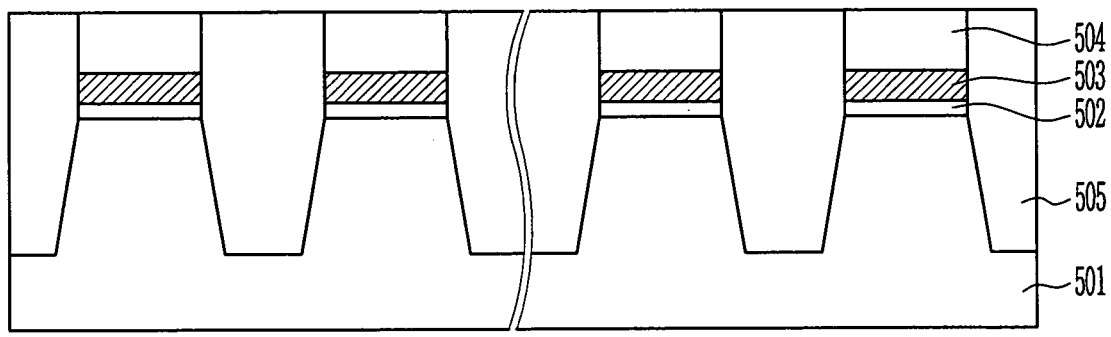
FIG. 5A to FIG. 5F are cross-sectional views sequentially illustrating flash memory devices taken along lines A–A' in FIG. 4 in order to explain a method for manufacturing a flash memory device according to an embodiment of the present invention.
Figure 5B:
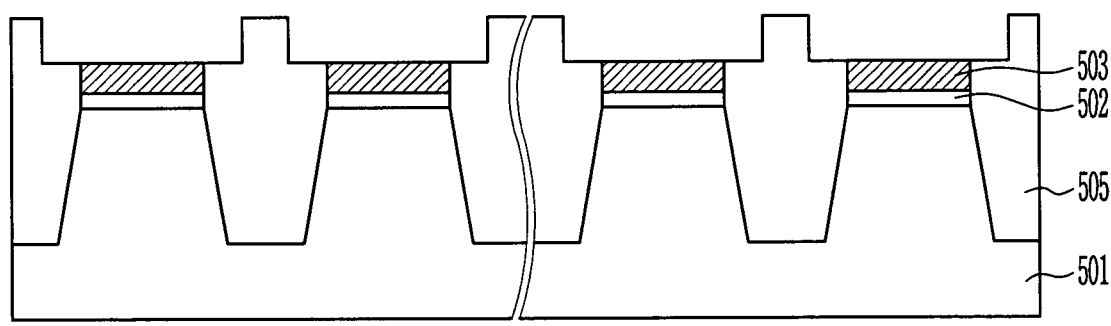
Figure 5C:
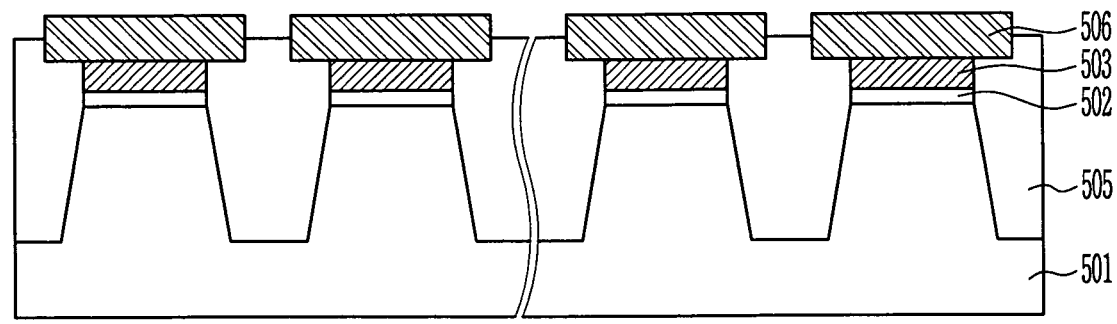

Processes described with reference to FIG. 5A to FIG. 5C are the same as those described with reference to FIG. 3A to FIG. 3C. Thus, description on them will not be given.

Figure 5D:
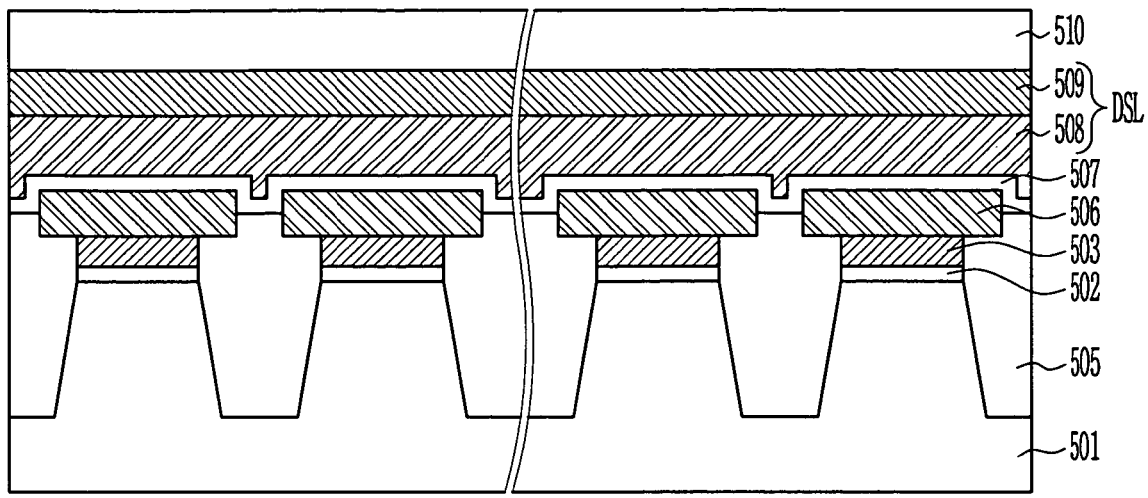

Referring to FIG. 5D, an isolation layer 505 is formed in an isolation region and first and second polysilicon layers 503 and 506 are formed in an active region between the isolation layers 505. In this state, a dielectric layer 507, a third polysilicon layer 508 for a control gate and a tungsten silicide layer 509 are sequentially formed on the entire structure. At this time, a dielectric layer is formed even in the select lines (DSL and SSL in FIG. 4).

Meanwhile, the control gate may be formed by depositing only a conductive material such as W, WSix, CoSix and TiSix instead of the third polysilicon layer 508 and the tungsten silicide layer 509. Alternately, after the third polysilicon layer 508 is formed, the conductive material such as W, WSix, CoSix and TiSix may be deposited on the layer 508.

Thereafter, the tungsten silicide layer 509, the third polysilicon layer 508, the dielectric layer 507, the second polysilicon layer 506 and the first polysilicon layer 503 are patterned by means of an etch process using an etch mask in which word lines and select lines are defined, thus forming select lines (DSL and SSL in FIG. 4) and word lines WLa1 to Wlan and WLb1 to WLbn.

Thereafter, an impurity is implanted into the semiconductor substrate 501 by means of an ion implantation process, so that source/drain is formed in an active region around the select lines (DSL and SSL in FIG. 2) and the word lines WLa1 to Wlan and WLb1 to WLbn.

An interlayer insulating layer 510 is formed on the entire structure.

Figure 5E:
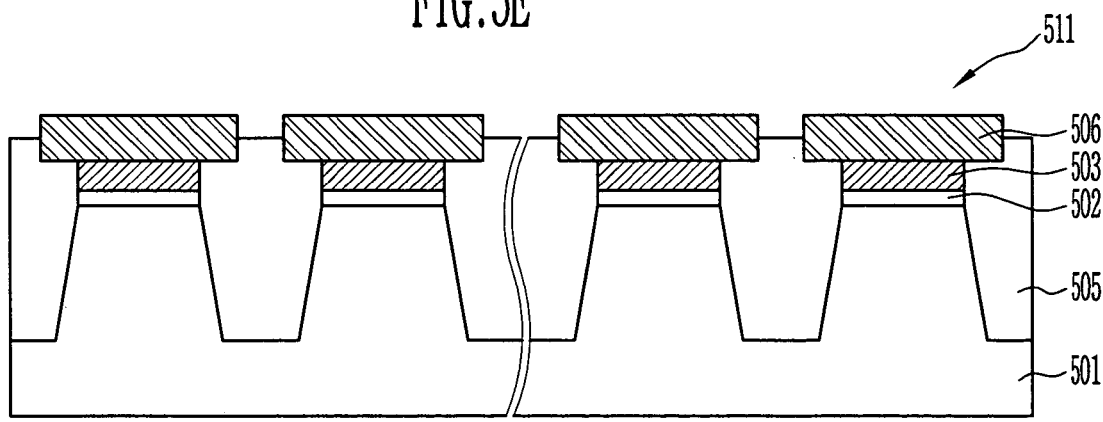

Referring to FIG. 5E, a contact hole 511 is formed in the interlayer insulating layer 510 by means of an etch process. At this time, if the contact hole 511 is formed on the select lines (DSL and SSL in FIG. 4), the second polysilicon layer 506 is exposed by etching up to the tungsten silicide layer 509, the third polysilicon layer 508 and the dielectric layer 507 as well as the interlayer insulating layer 510. Thus, the contact hole 511 through which the second polysilicon layer 506 is exposed is formed in the region where the select lines (DSL and SSL in FIG. 4) are formed. It is preferable that the contact hole 511 has a short side and a long side whose ratio is over 1:2.

Thereafter, in order to further reduce a sheet resistance of the second polysilicon layer 506, an impurity may be implanted into the second polysilicon layer 506 of the select line (DSL and SSL in FIG. 2) region, which is exposed through the contact hole 511.

Figure 5F:
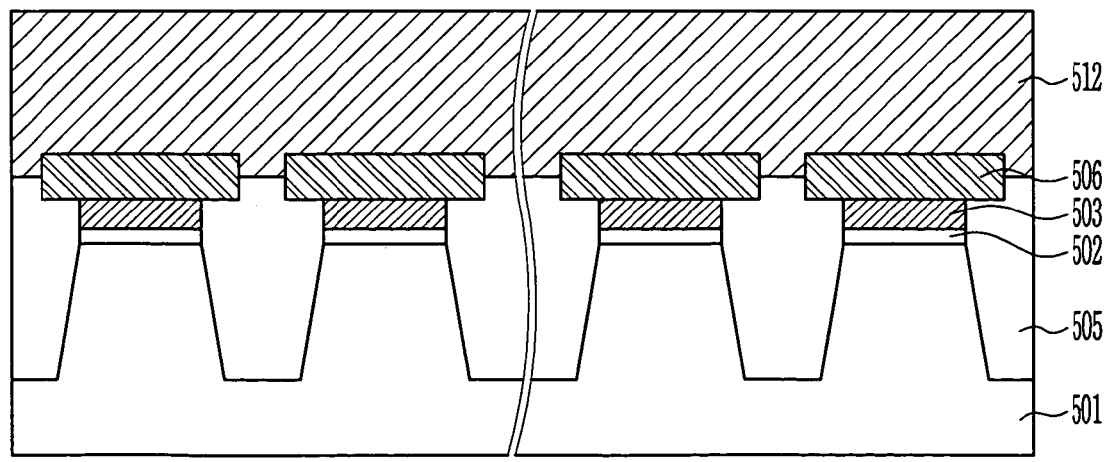

Referring to FIG. 5F, the contact hole (511 in FIG. 5E) is filled with a conductive material to form a contact plug 512. In the above, the contact plug 512 may be formed using polysilicon or a metal material. Thus, the contact plug 512 is directly physically and electrically connected to the second polysilicon layer 506. By directly physically and electrically connecting the contact plug 512 and the second polysilicon layer 506 as such, it is possible to reduce the sheet resistance and the contact resistance of the select lines (DSL and SSL in FIG. 4).

Figure 6A:
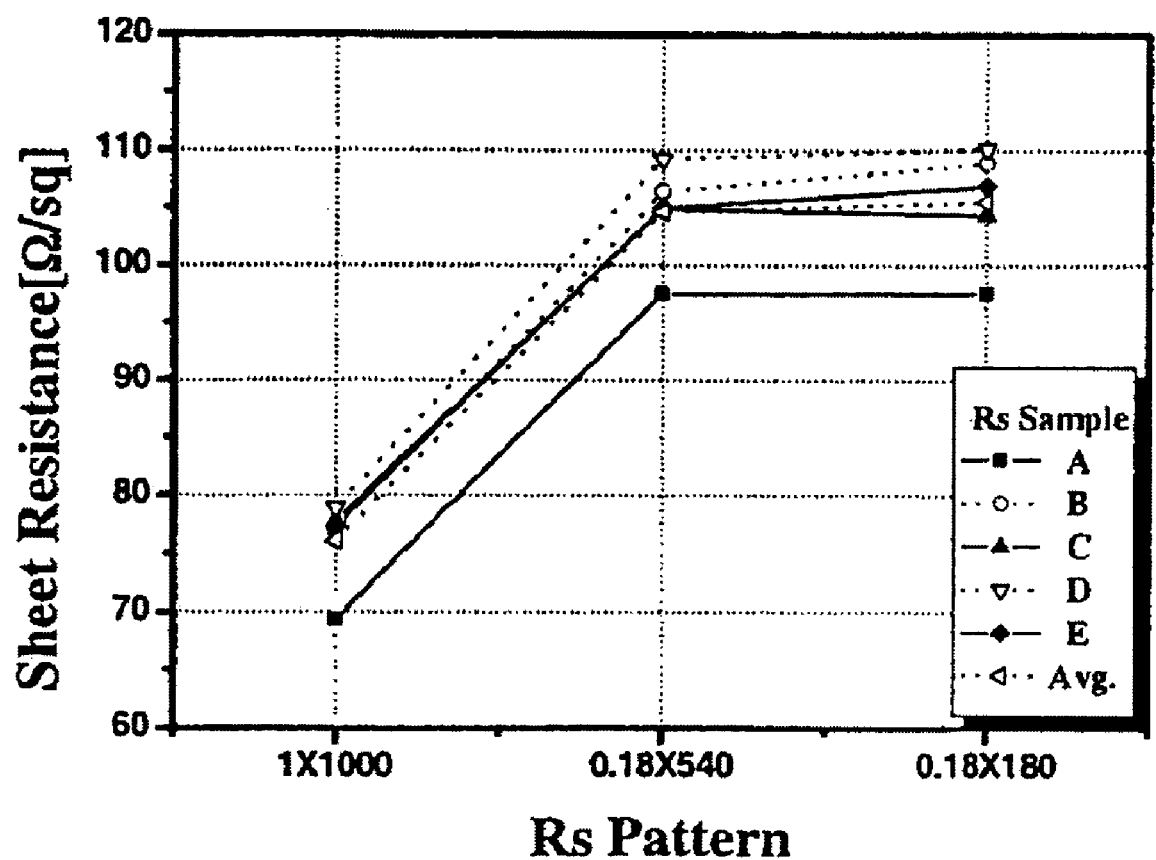
FIG. 6A and FIG. 6B are characteristic graphs shown to compare gate sheet resistance of select transistors in the related art and the present invention.
Figure 6B:
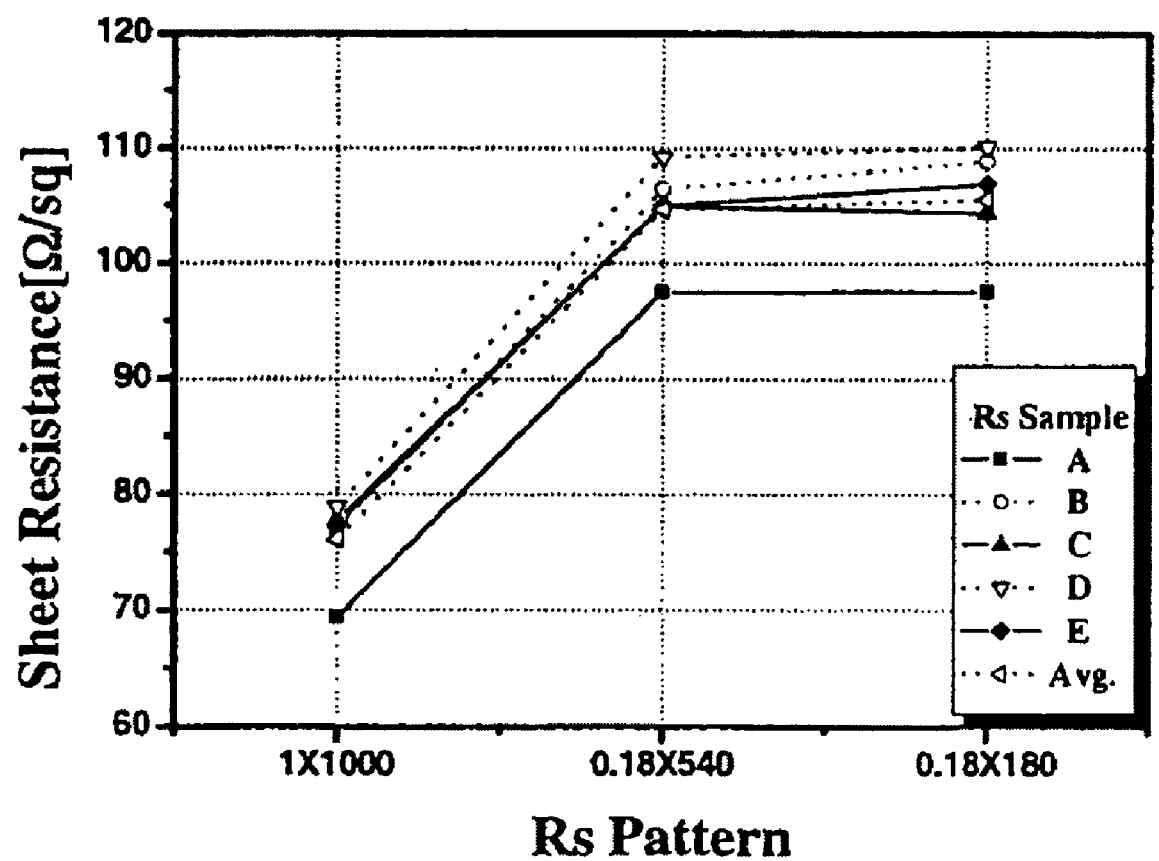

FIG. 6A and FIG. 6B are characteristic graphs shown to compare gate sheet resistance of select transistors.

From FIG. 6A, it can be seen that the sheet resistance is 70 to 110 Ω/sq in the prior art. However, from FIG. 6B, it can be seen that the sheet resistance is reduced to 14 to 20 Ω/sq in the present invention.

According to the present invention described above, a dielectric layer is removed from select lines and all the polysilicon layers are directly physically and electrically connected, or all the materials on a polysilicon layer for a floating gate are removed and the polysilicon layer for the floating gate and a contact plug are directly connected. Therefore, the present invention has new effects that it can reduce a contact resistance and sheet resistance of select lines, obviate a contact process, and remove a contact area to reduce a process step and also to improve the integration level.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method for manufacturing a flash memory device, comprising the steps of:
    providing a semiconductor substrate in which a plurality of word lines, a drain select line and a source select line are formed, wherein the word lines have a stack structure of a material layer for a floating gate, a dielectric layer and a material layer for a control gate;
    forming an interlayer insulating layer on the entire structure;
    forming a contact hole by etching the material layer for the control gate and the dielectric layer in the drain select line and the source select line so that the material layer for the floating gate in the drain select line and the source select line is exposed; and
    filling the contact hole with a conductive material layer to form a contact plug.

2. The method as claimed in claim 1, further comprising the step of before the contact plug is formed, implanting an impurity into the material layer for the floating gate that is exposed through the contact hole in order to lower resistance of the material layer for the floating gate.

3. The method as claimed in claim 1, comprising forming the contact plug using polysilicon or a metal material.

* * * * *